(12) United States Patent
Clingman et al.

(10) Patent No.: US 6,994,762 B2
(45) Date of Patent: Feb. 7, 2006

(54) SINGLE CRYSTAL PIEZO (SCP) APPARATUS AND METHOD OF FORMING SAME

(75) Inventors: Dan J. Clingman, Auburn, WA (US); A. Dean Jacot, Kent, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 10/361,533

(22) Filed: Feb. 10, 2003

(65) Prior Publication Data

US 2004/0154730 A1 Aug. 12, 2004

(51) Int. Cl.
B32B 31/00 (2006.01)

(52) U.S. Cl. .................. 156/160; 29/25.35; 29/446; 310/311; 310/340

(58) Field of Classification Search ............ 156/160, 156/272.2; 29/25.35, 446; 310/340, 311
See application file for complete search history.

(56) References Cited

U.S. PATENT DOCUMENTS

| | | | |
|---|---|---|---|
| 3,456,134 A | | 7/1969 | Ko |
| 3,466,473 A | | 9/1969 | Rhoten |
| 3,553,588 A | | 1/1971 | Honig |
| 3,624,451 A | | 11/1971 | Gauld |
| 4,220,886 A | * | 9/1980 | Ciszewski et al. .......... 310/325 |
| 4,467,236 A | | 8/1984 | Kolm et al. |
| 4,510,484 A | | 4/1985 | Snyder |
| 5,305,507 A | * | 4/1994 | Dvorsky et al. ........... 29/25.35 |
| 5,632,841 A | | 5/1997 | Hellbaum et al. |
| 5,751,091 A | | 5/1998 | Takahashi et al. |
| 5,849,125 A | | 12/1998 | Clark |
| 5,918,502 A | | 7/1999 | Bishop |
| 6,030,480 A | * | 2/2000 | Face et al. ................. 156/160 |
| 6,162,313 A | | 12/2000 | Bansemir et al. |
| 6,236,143 B1 | | 5/2001 | Lesieutre et al. |
| 6,382,026 B1 | | 5/2002 | Tajika et al. |
| 6,407,484 B1 | | 6/2002 | Oliver et al. |
| 6,530,276 B2 | | 3/2003 | Tajika et al. |

FOREIGN PATENT DOCUMENTS

| | | |
|---|---|---|
| EP | 0 483 955 A1 | 5/1992 |
| EP | 1201419 | 5/2002 |
| GB | 2 064 883 | 11/1979 |
| JP | 58 070589 A | 7/1983 |
| JP | 4-274377 A * | 9/1992 |
| JP | 8-306979 A * | 11/1996 |

OTHER PUBLICATIONS

Abstract of Soviet Union Patent 1727026 published by Derwent, Derwent acc No. 1993–084975, $10^{th}$ week, 1993.*

Niezrecki, et al, Piezoelectric Actuation: State of the Art, The Shock and Vibration Digest, vol. 33, No. 4, Jul. 2001, pp. 269–280.*

Newsbureau publication entitled "Residual stress in piezo-electric ceramics can be reduced, put to work"; by James E. Kloeppel Sep. 1, 2000.

2001 Face International Corporation, "Thunder White Paper" dated Feb. 21, 2001, 10 pages.

(Continued)

*Primary Examiner*—Jeff H. Aftergut
(74) *Attorney, Agent, or Firm*—Harness Dickey & Pierce P.L.C.

(57) ABSTRACT

A single crystal piezo (SCP) apparatus and method of forming same. The apparatus is ideally suited for actuator and energy harvesting applications. The apparatus includes an SCP layer bonded to a surface of a flexible metal layer while the metal layer is held flattened within a press or other tool. Once the bonding process is complete, the metal layer imparts a compressive strain to the SCP layer bonded thereto. A layer of uniaxial graphite may also be bonded to the SCP layer to eliminate the poison's ratio tension that would otherwise be created in the SCP layer.

19 Claims, 2 Drawing Sheets

OTHER PUBLICATIONS

F.J. von Preissig and E.S. Kim, topics in Finite–Element Modeling of Piezoelectric MEMS.

Ibong Jung, Yongrae Roh, "Design and fabrication of piezoceramic bimorph vibration sensors", 1998.

John Kymissis, Clyde Kendall, Joseph Paradiso, Neil Gershenfeld, "Parasitic Power Harvesting in Shoes", Aug. 1998, p. 1–8.

Kloeppel, James E., Residual stress in piezoelectric ceramics can be reduced, put to work, News Bureau (Sep. 1, 2000).

Meteer, Jami, Front–Side Processing of a Piezoelectric MEMS Accelerometer, The Pennsylvania State University National nanofabrication users Network, pp. 48–49.

Sitti M et al., "Development of PZT and PZN–PT based unimorph actuators for micromechanical flapping mechanisms"; Proceedings 2001 IEEE International Conference on Robotics and Automation, ICRA 2001, Seoul, Korea 21–26 May 2001, pp. 3839–3846.

Hackenberger W et al "Single Crystal Piezoelectrics for Advanced Transducer and smart structure applications" Proceedings of Spie, vol. 4333, 2001, pp. 92–103, XP002297415; ISSN: 0277–786X.

* cited by examiner

SINGLE CRYSTAL PIEZO (SCP) APPARATUS AND METHOD OF FORMING SAME

STATEMENT OF GOVERNMENT RIGHTS

This invention was produced pursuant to U.S. Government Contract No. N66604-99-3-4671 with the Defense Advanced Research Projects Agency (DARPA). The U.S. Government has certain rights in the invention.

FIELD OF THE INVENTION

The present invention relates to piezoelectric devices and methods of manufacturing same, and more particularly to a single crystal piezo (SCP) apparatus manufactured to impart a compressive prestress thereto to significantly harden the apparatus.

BACKGROUND OF THE INVENTION

Conventional ceramic piezo wafers, such as PZT, are often constructed for use in connection with bi-morph or unimorph actuators. To use the piezo wafer as an actuator or possibly as an energy harvesting device, it must be strengthened during manufacture by imparting a compressive prestress thereto. One such means for prestressing a wafer of piezoelectric material in a manner that strengthens it is by bonding the layer of piezoelectric material to a "prestressing layer" using a high temperature polyimide adhesive. The compressive stress in the piezoelectric layer is induced by the difference in coefficient of thermal expansion between the piezoelectric material and both the prestressing layer and the adhesive, both of which have much higher coefficients of thermal expansion than the piezoelectric material.

Another approach to hardening a piezoelectric material involves sandwiching a piezoelectric layer of material between two fiber composite panels that are under tension in at least one direction of their plane during the bonding process. The composite panels are held under tension until the bond cures, at which point they are released and a compressive stress is induced in the piezoelectric material.

Until the present time, certain "smart" materials, such as single crystal PZN-PT or PMN-PT, which are known as single crystal piezo ("SCP") material, have not been used in connection with actuators and/or energy harvesting devices because of the lack of hardness of these materials. This lack of hardness makes SCP material highly prone to fracturing when the SCP material is placed under tension. However, SCP material would otherwise be ideally suited for actuator and energy harvesting applications because of its very high energy density, which is many times that of conventional piezo material.

It is therefore desired to provide a means for manufacturing an actuator or energy harvesting device incorporating an SCP layer of material which is not prone or susceptible to fracturing when placed in tension. Such a hardened SCP material could then be used in a wide variety of tasks such as aerodynamic flow control and structural energy harvesting applications that would otherwise be impossible because of the tendency of the SCP material to fracture when placed in tension.

SUMMARY OF THE INVENTION

The present invention is directed to a single crystal piezo (SCP) apparatus and method of manufacturing same which makes the apparatus ideally suited for actuator and energy harvesting applications. In one preferred form the actuator includes a steel layer which is formed having a predetermined curvature such that one surface thereof forms a concave surface. A layer of SCP material is bonded to the steel layer while the steel layer is held in a flattened condition by a suitable tool. Once bonding is complete, the force is removed and the steel layer is allowed to flex back into its predetermined curvature. This causes a compressive prestrain to be applied to the SCP material as the steel layer assumes its original, predetermined curvature.

In one preferred embodiment a layer of uniaxial graphite is also bonded to a surface of the SCP material such that the SCP material is sandwiched between the uniaxial graphite layer and the steel layer. The uniaxial graphite material prevents the axis of the SCP wafer normal to its longitudinal surface in contact with the steel layer from going into tension as the steel layer is allowed to flex back into its predetermined curvature. In effect, the graphite fibers of the uniaxial graphite material serve to keep poison's ratio induced strain in compression and allow the SCP layer to energize the steel layer. Since the uniaxial graphite is orientated in the nonbending direction, any small stiffness is added in the bending direction.

The resulting SCP apparatus is ideally suited for actuator and energy harvesting applications due to its very high energy density. The compressive strength imparted to the SCP material of the apparatus prevents breakage as the SCP layer flexes during operation.

Further areas of applicability of the present invention will become apparent from the detailed description provided hereinafter. It should be understood that the detailed description and specific examples are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses.

Figure 1:
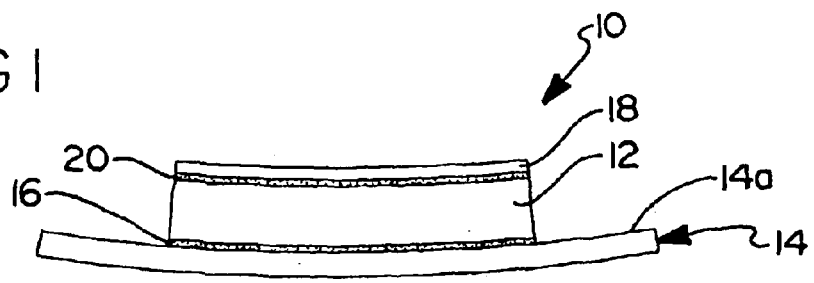
FIG. 1 is a side view of an SCP apparatus in accordance with a preferred embodiment of the present invention.

FIG. 1 is a simplified side view of a single crystal piezo (SCP) apparatus 10 in accordance with a preferred embodiment of the present invention. The SCP apparatus 10 generally includes a layer of single crystal piezo (SCP) material 12 which is bonded to a steel layer or substrate 14 via a suitable adhesive 16. The steel layer 14 typically comprises spring steel, but other suitable materials are brass, graphite epoxy composite and glass epoxy composite. The adhesive typically comprises epoxy with 5% weight glass beads 0.002 inch (0.0508 mm) in diameter, but again, it will be appreciated that any suitable adhesive can be utilized. In a preferred embodiment a layer of uniaxial graphite 18 is also bonded to the SCP material 12 via an adhesive 20. Preferably, a quantity of conductive epoxy, for example 10 milligrams, is also placed in the center of the adhesive layer 16 to allow for electrical conduction. Adhesive 20 may similarly comprise conductive epoxy. The SCP apparatus 10 can be used, for example, as an actuator to control aerodynamic flow control surfaces on aircraft and other mobile platforms, or just as readily as a structural energy harvesting apparatus for harvesting energy and generating an electrical output as the apparatus flexes.

With further reference to FIG. 1, an important feature is the formation of the steel layer 14 with a predetermined curvature that produces a concave surface 14a. During manufacture of the apparatus 10, as will be described momentarily, a compressive strain is introduced into the SCP material 12 when the metal layer 14 assumes the curvature shown in FIG. 1. This serves to harden the SCP layer 12 and prevent fracturing. Without the compressive strain imparted to the SCP material 12, flexing of the steel layer 14 could cause fracturing of the SCP material 12. As a result, without this characteristic of having an induced compressive strain when the SCP apparatus 10 is at rest (i.e., not experiencing any external force that would place it under tension), the apparatus 10 would not be reliable in applications involving actuators and energy harvesting where repeated flexing of the steel layer 14 would be expected.

Figure 2:
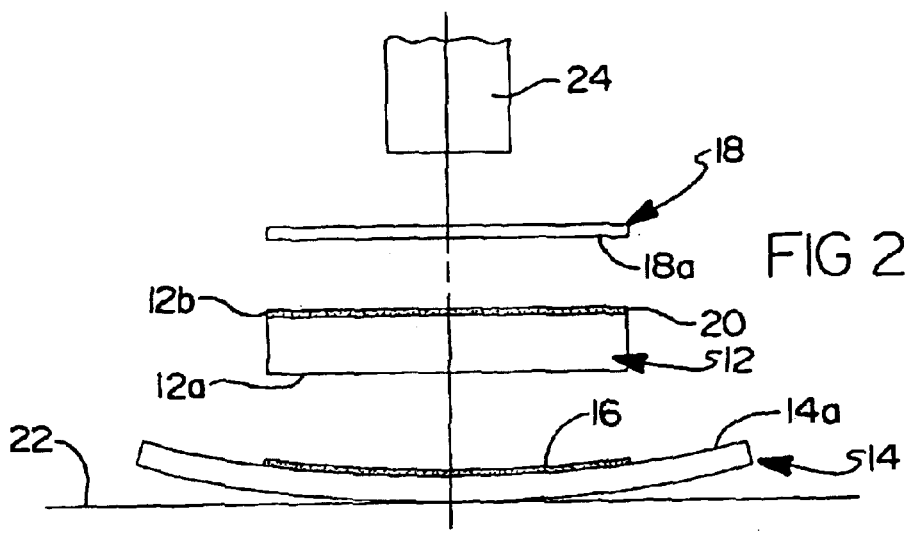
FIG. 2 is an exploded side view of the components of the apparatus of FIG. 1 prior to assembly.

Referring to FIG. 2, the manufacture of the apparatus 10 will now be described. Initially, the metal layer 14 is placed against a work surface 22 of a suitable tool, for example a press having a piston 24. The metal layer 14 is placed with its concave surface 14a facing the SCP material 12. The adhesive layer 16 is shown placed on the concave surface 14a of the metal layer 14, but it will be appreciated that the adhesive could just as readily be applied to a lower surface 12a of the SCP material 12. Adhesive layer 20 is also shown placed on the SCP material 12, but again this adhesive could also be placed on a lower surface 18a of the uniaxial graphite layer 18.

Figure 3:
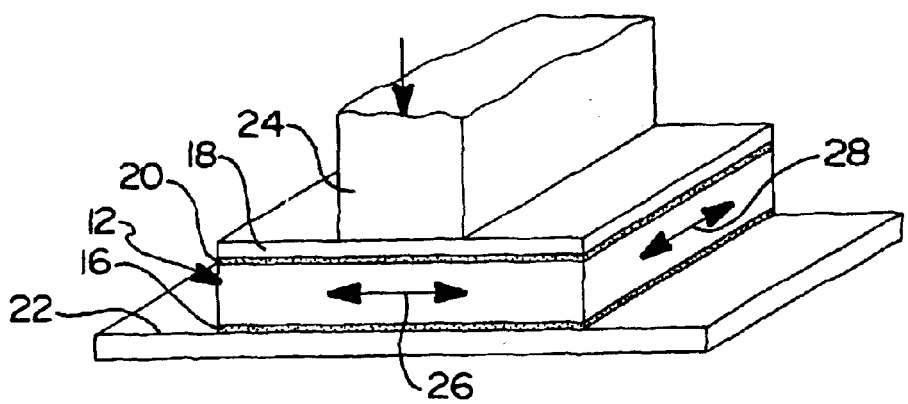
FIG. 3 is a side view of the components of the apparatus of FIG. 2 being bonded together via a suitable tool such as a press.

The press 24 is used to apply a sufficient force to the uniaxial graphite layer 18 and the SCP layer 12 to thus flatten the metal layer 14 down against the work surface 22 as shown in FIG. 3. The application of force is maintained for a time, for example one hour to twelve hours, sufficient to allow the adhesive layers 16 and 20 to bond to the surfaces with which they are in contact. This securely bonds the SCP layer 12 to the metal layer 14 and the uniaxial graphite layer 18 to the SCP layer 12. When the piston 24 is released, the steel 14 flexes or "springs" back into its preformed curvature shown in FIG. 1. As it does this, it imparts a compressive strain into the SCP layer along axis 26 shown in FIG. 3. However, due to the poison's ratio, the opposite axis (designated by arrow 28) of the SCP layer 12 would normally go into tension. The uniaxial graphite layer 18 includes fibers which are arranged horizontally in the drawing of FIG. 3 such that the layer 18 is stiff only in the direction indicated by arrow 28. Thus, the uniaxial graphite layer 18 serves to keep the poison's ratio induced strain in compression while still allowing the SCP material 12 to experience a compressive strain.

The foregoing apparatus and method effectively induces a compressive strain along the axis 26 shown in FIG. 3 once the steel layer is allowed to flex back into its preformed curvature. This compressive strain serves to significantly harden the SCP material 14 and prevent fracturing of same during flexing of the metal layer 14 when the SCP apparatus 10 is used as an actuator or energy harvesting device.

It will be appreciated that the significant energy density of the SCP layer 12 allows the apparatus 10 to be used in an energy harvesting application, for example, to generate sufficient power to power a radio frequency (RF) transmitter. In an actuator application, the apparatus 10 can be used as a bi-morph or unimorph actuator. The manufacturing process described herein further does not rely on the difference in the coefficient of thermal expansion between various layers of the apparatus, as with certain methods of prestressing piezo materials.

Figure 4:
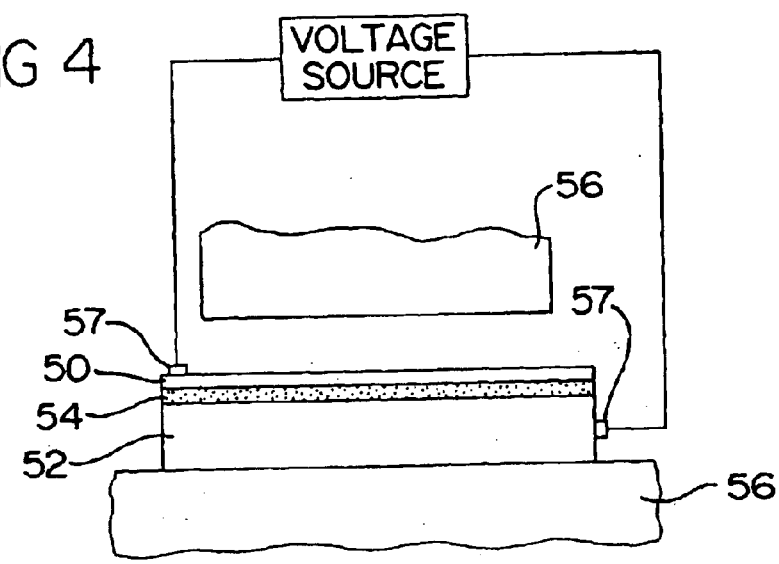
FIG. 4 is a side view of an alternative preferred embodiment of the present invention.

Referring to FIG. 4, an alternative preferred method in accordance with the present invention is shown. In this method, an SCP layer of material 50 is placed on a flexible, electrically conductive substrate 52. The substrate 52 has a layer of electrically conductive adhesive 54 thereon. In one preferred implementation, adhesive layer 54 is nonconductive but a microliter of electrically conductive adhesive is placed on the adhesive layer 54 at the center of the substrate 52.

Figure 5:
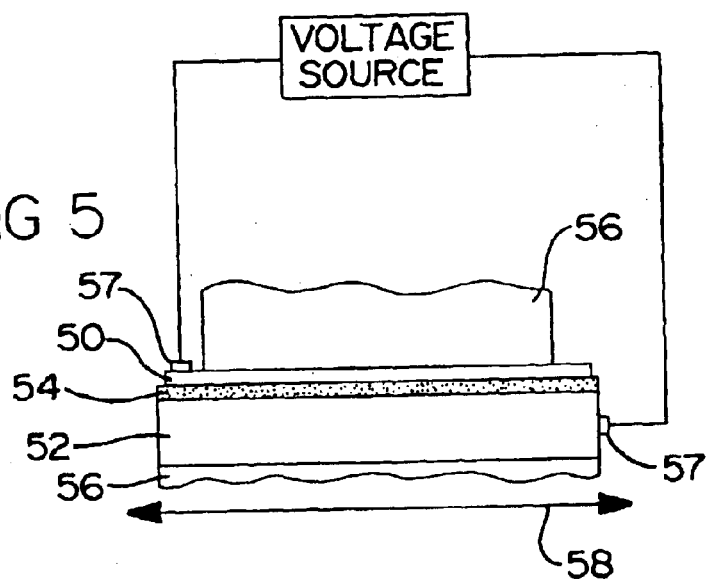
FIG. 5 is a side view of the embodiment of FIG. 4 with the SCP layer in a shortened condition and being held against the flexible substrates.

The substrate 52 and the SCP material 50 are placed in a suitable tool, such as a press 56, and a voltage is applied across the SCP material 50 via a pair of electrodes 57 temporarily secured to the SCP layer 50 and to the substrate 52, as shown in FIG. 5. The applied voltage causes the SCP material 50 to shrink in the direction of arrow 58. This direction is known in the art as the "3-1 direction". FIG. 5 illustrates the SCP material 50 in its longitudinally shortened condition. The necessary applied voltage field is typically within the range of about 0.5 megavolts per meter to 2 megavolts per meter.

The SCP layer 50 and substrate 52 are held within the press for a time sufficient to allow the adhesive 54 to fully set. This typically occurs after a time of between about one minute–12 hours, depending on the specific adhesive used.

Figure 6:
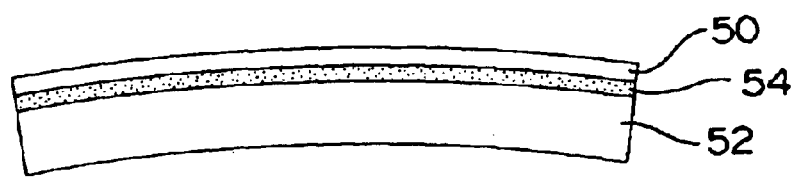
FIG. 6 is a view of the shape that the flexible substrate forms once the SCP layer is bonded thereto.

Referring to FIG. 6, when the adhesive 54 has fully set, the voltage is removed from the SCP layer 50. This causes the SCP layer 50 to expand in length along the axis of arrow 58 to its original length, which causes a compressive stress to be induced in the SCP layer by its attachment to the substrate 52. The substrate 52 will "bow" or bend slightly as a result of the lengthening of the SCP layer 50. The compressive stress induced significantly hardens and improves the fracture resistance of the SCP layer 50.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A method for imparting a compressive strain to a single crystal piezo (SCP) material, comprising:

placing a flexible substrate preformed in a curved shape on a support surface;

placing a first player of adhesive on a first surface of said flexible substrate;

placing a layer of single crystal piezo (SCP) material on said adhesive;

aligning a layer of uniaxial graphite over said SCP layer;

placing a second layer of adhesive on one of said SCP layer or said uniaxial graphite layer; and bonding said SCP layer to said flexible substrate in a manner that causes sandwiching of said uniaxial graphite layer to said SCP layer and said flexible substrate, and that further causes a spring force of said flexible substrate to impart a compressive stress into said SCP material, said uniaxial graphite layer preventing a tensile strain from being created in said SCP material in a direction orthongal to axis along which said compressive stress is imparted.

2. The method of claim 1, wherein said step of placing said flexible substrate comprises placing a curved flexible substrate within a tool suitable for temporarily flattening said flexible substrate.

3. The method of claim 2, wherein said step of bonding comprises bonding said layer of SCP material to said flexible substrate while said flexible substrate is held in a flattened condition.

4. The method of claim 1, wherein said bonding step comprises:
  applying a voltage to said SCP material to cause said SCP material to shorten in longitudinal length; and
  allowing said adhesive to set before removing said voltage, said flexible substrate operating to impart said compressive stress as said voltage is removed.

5. The method of claim 4, wherein said bonding step comprises holding said SCP layer under pressure against said flexible substrate while said flexible substrate is held against a tool surface.

6. The method of claim 1, wherein said step of placing said flexible substrate against said support surface comprises placing a flat, flexible substrate against said support surface.

7. A method of imparting a compressive strain to a single crystal piezo (SCP) material, comprising:
  placing a flexible substrate component having a predetermined curvature on a first surface;
  placing a first layer of adhesive on a concave contact surface of said substrate component;
  placing a layer of SCP material on said concave contact surface of said substrate component;
  aligning a layer of unaxial graphite over said SCP layer;
  placing a layer of adhesive onto one of a surface of said SCP material which is opposite to said surface facing said substrate component or to a surface of said uniaxial graphite layer;
  placing a layer of unaxial graphite against said surface of said SCP material opposite to said surface facing said substrate component;
  applying a force to said SCP material from a side opposite to that which is in contact with said concave contact surface, so as to flatten said substrate component against said first surface with said uniaxial graphite layer held against said SCP material and said substrate component;
  maintaining said force applied to said SCP material and said substrate component for a time sufficient to allow said adhesive to bond said SCP material, said uniaxial graphite layer and said substrate component together; and
  removing said force to allow said substrate component to flex back to its said predetermined curvature to thus apply a compressive strain to said SCP material, with said uniaxial graphite layer preventing a tensile strain from being generated in said SCP material along an axis orthogonal to an axis along which said compressive stress is generated.

8. The method of claim 7, wherein the step of placing a substrate component on a first surface comprises placing a brass component against said first surface.

9. The method of claim 7, wherein the step of placing a substrate component on a first surface comprises placing a graphite epoxy composite component against said first surface.

10. The method of claim 7, wherein the step of placing a substrate component on a first surface comprises placing a glass epoxy composite component against said first surface.

11. The method of claim 7, wherein the step of maintaining said force applied to said SCP material comprises maintaining said force for a time period of at least about one hour.

12. The method of claim 7, wherein the step of placing a layer of adhesive on a contact surface of said substrate component comprises placing a layer of electrically conductive epoxy on said contact surface.

13. The method of claim 7, wherein the step of placing a flexible substrate comprises placing a flexible steel substrate on said first surface.

14. A method of forming an apparatus having a single crystal piezo (SCP) layer, comprising:
  placing a first adhesive layer on a concave side of a flexible component having a predetermined curvature;
  placing a layer of single crystal piezo (SCP) material having a first surface and a second surface against said first adhesive layer such that said second surface thereof is in at least partial contact with said first adhesive layer;
  placing a second adhesive layer on said first surface of said SCP material;
  placing a layer of uniaxial graphite at least partially against said second adhesive layer;
  applying a force to said first surface of said SCP material sufficient to at least substantially flatten said flexible component with said uniaxial graphite layer pressed against said second adhesive layer;
  maintaining an application of said force for a time sufficient to bond said SCP material to said flexible component with said uniaxial graphite layer bonded to said SCP material; and
  removing said application of force to allow said flexible component to flex back into said predetermined curvature, thereby generating a compressive strain in said SCP material, while said uniaxial graphite layer prevents a tensile stress from being generated in said SCP material.

15. The method of claim 14, wherein said step of placing a first adhesive layer on a concave side of a flexible component comprises placing said first adhesive layer on a length of spring steel.

16. The method of claim 14, wherein the step of placing a first adhesive layer on a concave side of a flexible component comprises placing an electrically conductive epoxy on said concave side.

17. The method of claim 14, wherein the step of maintaining said force comprises maintaining said force for a time period of at least about one hour.

18. The method of claim 14, wherein the step of placing a first adhesive layer on a concave side of a flexible component comprises placing an adhesive on a concave side of one of:
  a brass component;
  a graphite epoxy composite component; and a glass epoxy composite component.

19. A method for forming an energy harvesting apparatus, comprising:
  providing a flexible layer of material having a preformed curvature forming a concave surface;

providing a layer of single crystal piezo (SCP) material;

placing a first layer of adhesive on one of said flexible layer and said layer of SCP material;

aligning a layer of uniaxial graphite over said SCP material;

placing a layer of second adhesive on said SCP material facing said layer of uniaxial graphite;

placing said flexible layer, said SCP material and said uniaxial graphite layer adjacent one another;

applying a force to one of said flexible layer, said SCP material and said uniaxial graphite layer sufficient to flatten said flexible layer and to hold said uniaxial graphite layer against said SCP material;

maintaining an application of said force for a time sufficient to bond said flexible layer to said SCP material; and removing said force to allow said flexible layer to flex back into said preformed curvature, thus providing a compressive strain to said SCP material, while said uniaxial graphite layer prevents a tensile strain from being developed in said SCP material along a first axis, which is orthogonal to a second axis along which said compressive strain is induced.

* * * * *